(12) United States Patent
Ramm et al.

(10) Patent No.: US 8,197,648 B2
(45) Date of Patent: *Jun. 12, 2012

(54) METHOD FOR DEPOSITING ELECTRICALLY INSULATING LAYERS

(75) Inventors: Juergen Ramm, Maienfeld (CH); Beno Widrig, Bad Ragaz (CH); Christian Wohlrab, Feldkirch (AT)

(73) Assignee: Oerlikon Trading AG, Truebbach, Truebbach (CH)

( * ) Notice: Subject to any disclaimer, the term of this patent is extended or adjusted under 35 U.S.C. 154(b) by 537 days.

This patent is subject to a terminal disclaimer.

(21) Appl. No.: 12/374,319

(22) PCT Filed: Jul. 12, 2007

(86) PCT No.: PCT/EP2007/057179
§ 371 (c)(1),
(2), (4) Date: Jan. 19, 2009

(87) PCT Pub. No.: WO2008/009619
PCT Pub. Date: Jan. 24, 2008

(65) Prior Publication Data
US 2009/0166188 A1 Jul. 2, 2009

(30) Foreign Application Priority Data
Jul. 19, 2006 (CH) ........................... 1166/06

(51) Int. Cl.
*C23C 14/08* (2006.01)
*C23C 14/32* (2006.01)
*C23C 14/56* (2006.01)
(52) U.S. Cl. .................. 204/192.38; 204/298.41
(58) Field of Classification Search .............. 204/192.38
See application file for complete search history.

(56) References Cited

U.S. PATENT DOCUMENTS

| | | | |
|---|---|---|---|
| 3,625,848 A | 12/1971 | Snaper | |
| 5,103,766 A * | 4/1992 | Yoshikawa et al. | 204/298.41 |
| 7,857,948 B2 * | 12/2010 | Ramm et al. | 204/192.38 |
| 2003/0209424 A1 | 11/2003 | Brandle et al. | |

FOREIGN PATENT DOCUMENTS

| | | |
|---|---|---|
| EP | 0658634 A1 | 6/1995 |
| EP | 0729173 A1 | 8/1996 |
| EP | 1081248 A2 | 3/2001 |

OTHER PUBLICATIONS

Amaratunga G A J et al: "Amorphous Diamond-Si Semiconductor Hetrojunctions", Applied Physics Letters, Jul. 1, 1991, pp. 69-71, vol. 59, No. 1, American Institute of Physics, Melville, NY, USA.

* cited by examiner

*Primary Examiner* — Mark F Huff
*Assistant Examiner* — John S Ruggles
(74) *Attorney, Agent, or Firm* — Pearne & Gordon LLP (57) ABSTRACT

A method for producing a low-conductivity layer on at least one workpiece by vacuum coating is provided. The method includes operating an electrical arc discharge between an anode and a cathode of an arc source in an atmosphere containing a reactive gas. A small external magnetic field is generated to be essentially perpendicular to a target surface of a target, which is electrically connected to the cathode, to assist an evaporation process. A degree of recoating of the target surface by other coating sources in a vacuum coating installation is less than 10%, and the magnetic field is generated by a magnet system with an axially-polarized coil having a geometry similar in size to that of the target.

Excitation current for the electrical arc discharge is supplied through the axially-polarized coil.

20 Claims, 4 Drawing Sheets

METHOD FOR DEPOSITING ELECTRICALLY INSULATING LAYERS

TECHNICAL FIELD

Method for producing insulating layers by means of one or several arc sources, where no or only a small magnetic field is generated on the target surface for assisting the evaporation process. In particular, the method relates to the production of oxides and the operation of at least one arc source in an atmosphere containing oxygen.

DEFINITIONS

In the framework of the present application, consisting of description, figures and claims, a "small" magnetic field is to be understood as a magnetic field that amounts to between 3 and 50 Gauss (both limit values being included), preferably between 5 and 25 Gauss (both limit values being included).

In the present application, consisting of description, figures and claims, a low-conductivity or lower-conductivity material is to be understood as a material whose electric conductivity is less than the electric conductivity of metals and of metal alloys.

In the framework of the present application, consisting of description, figures and claims, a magnetic field that is "essentially" perpendicular to the target surface, is to be understood as a magnetic field that has a component parallel to the target surface—a radial component—that is smaller than the component perpendicular to the target surface: the resulting field vector includes an angle with a surface normal onto the target surface that has a value less than 45°. The radial field component can also be zero, in that case the field vector and the surface normal then coincide.

In the framework of the present application, consisting of description, figures and claims, an essentially axially polarized coil is to be understood as a coil whose axis includes an angle with the surface normal of the target surface in its center that has a value less than 45°.

A magnet system consisting of a coil that has a geometry "similar" in size to the target is to be understood as a magnet system that, seen from above on the target surface, runs inside and/or outside the target surface and along its circumferential area, seen from the side is placed at least partly beneath and/or at least partly above and/or at least partly on the same level as the edge of the target.

STATE OF THE ART

With arc methods according to the state of the art so far, spark sources in an atmosphere containing oxygen, in particular in pure oxygen, can be operated only very badly or not at all in a manner practical for industrial applications. For example, use of known arc sources, whose magnetic fields are designed so as to steer the spark onto essentially circular paths, has shown that the surfaces of the target are covered with thick layers of oxides and the coating process becomes instable. The target surface onto which the spark runs constricts itself, i.e. the spark runs on a continuously shrinking area of the target, and the target surface that is not used becomes strongly oxidized. This leads first to stronger splatter formation and finally to instabilities and the spark becoming extinguished.

A process control in which arc targets are swept with inert gas and the reactive gas is let in close to the substrate surface cannot be used in every case because of the considerable complexity of the technical installation and does not always yield successful results, since with too high a concentration of inert gas for example a mixture of metal and of the actually desired metal compound is deposited.

Another possibility for solving this problem is to pulse the spark stream, either by applying a DC and a pulse current power supply simultaneously, as described in CH00518/05 and Ch1298/2005, or by applying a single pulsed current power supply. In this manner it is possible to operate several arc sources continuously and steadily also when they run in an atmosphere containing oxygen and their surfaces get covered during the process with an insulating layer. For this purpose, in addition to the DC-power supply, it is however necessary to have a pulse current power supply or a special, and thus accordingly costly, single generator capable of overlaying a suitable pulse current pattern over a base current.

When depositing conducting layers, such as for example TiN, AlTiN, AlCrN among others, it has been known for a long time that with a magnetic field running increasingly parallel to the surface, the droplet density diminishes, whilst with field lines oriented perpendicularly to the target surface, larger macro-particles tend to be emitted. Examples for arc sources with field lines essentially parallel to the surface with a small perpendicular magnetic field component are disclosed in CH 00792/06 and WO2004/057,642.

Furthermore, it is known from DE4,223,592 (Hovsepian) that in order to minimize the number of droplets and optimize the target yield, an external magnetic field, whose value does not exceed 10 Gauss (=10-3 Tesla), can be set to the current value of the intrinsic magnetic field generated by the arc current on the target surface. This can for example be achieved with a coil inserted between the target and the current source. In that case, the performance of the vaporizer is further stabilized by the magnetic coil's inductance and at the same time the plasma formation is increased.

A totally different approach is suggested in U.S. Pat. No. 6,334,405 with a field line direction that is essentially perpendicular to the target surface. In this case, the field-generating coil or the magnetic ring is placed at the same height as or in front of the target surface. Simultaneously, considerably stronger magnetic fields are used compared to the methods described here above.

From the state of the art so far, it is not known to optimize magnetic fields as regards spark evaporation for the production of insulating oxidic layers, where insulating or at least low-conductivity layer zones are also formed at least momentarily on the surface of the target. Arc methods for depositing such layers have not been used industrially until now because of the described difficulties and only isolated cases are mentioned in the prior art.

One exception is constituted by patent EP0,285,745B1, wherein a droplet reduction during a spark evaporation is described, based upon the two-way coating for example of two spark targets lying opposite one another. Behind this lies the observation that after the vacuum coating installation has been pumped out and immediately after the spark has been lit, the spark is initially split more strongly and less droplets are generated. The document describes a method for coating workpieces with different compounds containing metal, such as TiN, ZrN and $ZrO_2$, where the arc target is exposed to renewed coating through a suitably positioned second evaporation source at a ratio of 12 to 25% of its specific evaporation rate. The coils for generating the magnetic fields over the spark targets are in this case Helmholtz coils placed outside the vacuum and that allow an increase of the two-way coating rate already at magnetic field strengths of about 10 Gauss.

Such a method is however problematic for several reasons. On the one hand, a certain target arrangement must be maintained and at the same time the regularity of the coating must be ensured, on the other hand, the two-way coating always results in a loss of the coating rate on the workpieces and, consequently, in a reduced economic efficiency of the method.

Representation of the Invention

One aim of the present invention is to make available a method for depositing low-conductivity, in particular insulating, layers by means of spark evaporation that avoids the disadvantages of the state of the art and makes it possible to conduct such a spark evaporation process with good productivity. A further aim is to make available a method through which it is possible for the first time to operate a spark evaporation process with continuous long-term stability in an atmosphere containing reactive gas where low-conductivity or insulating layers are deposited, without using pulsed arc sources and/or simultaneous sweeping of the arc sources with inert gas or simultaneous recoating of the vaporized target surface.

Surprisingly, it has been shown that with a relatively simple measure, such as the application at the target surface of a small external magnetic field essentially perpendicular to it generated by means of at least one axially polarized coil with a geometry similar in size to the target and a vertical component $B_z$ as well as a smaller component $B_r$ essentially, i.e. over the majority of the target surface, radial or parallel to the surface, a coating process that remains stable over a long term is possible also for the production of low-conductivity, in particular insulating, layers. Preferably, the vertical component $B_z$ is set at the target surface in a range between 3 and 50 Gauss, in particular however in a range between 5 and 25 Gauss.

With such a method the need for two-way coating described in the prior art also becomes superfluous, so that the degree of recoating of the target surface by other coating sources can be chosen as being less than 10%, preferably less than 5%, in particular preferably less than 1% or zero % of the metal quantity discharged by the cathode.

Alternatively, the inventive method can also be performed totally without magnetic field, although in this case it is necessary to forgo the advantageous increased ionization that occurs already when applying small magnetic fields over the target surface.

Thus the disposition of the spark source(s) can be chosen essentially freely, for example parallel, at an angle to one another or even opposite one another, and the workpieces to be coated can for example be positioned or moved at will between several spark sources, so that the target material is used better and the coating rate is increased. It is also possible in this case to do without further remedial measures usual so far, such as sweeping the target with inert gas or admixing larger proportions of inert gas to the reactive gas. In particular, the process can also be performed with an inert gas part of less than 30%, preferably less than 10%, without adjunction of inert gas. A combination of the present invention with the process assistance known from CH00518/05 (reactive pulsed arc) and CH1289/2005 (dual pulsed arc) by applying a pulse signal to the arc cathode(s) is not necessary in this case, even though such a combination could prove advantageous for certain applications, for example if an increased ionization, a better target exploitation, a higher coating rate or a faster movement of the spark on the target surface are desired.

The magnetic field over the target surface in that case is to be set in such a manner that it does not become large enough to keep the spark on geometrically defined paths. This is achieved by setting the vertical component $B_z$ of the magnetic field to values lower than 50 Gauss, preferably however lower than 25 Gauss. The component $B_r$ is to be set correspondingly smaller.

If low-conductivity or insulating layers are deposited with such processes, it is possible to avoid the difficulties known from DC-methods with arc sources assisted by magnetic fields, such as extensive contamination of the target surface and resulting decrease of the coating rate, limitation of the active target surface, and process instabilities that can lead to failure of the arc source. Simultaneously it is possible with this method to achieve a better quality of the surface of the substrate since the spark, already at comparatively small spark streams, separates into several small flash points that quickly move over the target surface and thus enable a regular target removal with a low emission of droplets. The contamination of the target surface, by comparison with conducting surfaces, thus seems to contribute additionally to a better distribution of the spark.

This effect is particularly clear for insulating layers that increase the electron emission of the metallic target surface. Examples of this are aluminum oxide layers or aluminum metal oxide layers that can be produced by evaporation of aluminum alloys for example with one or several of the transition metals of the IVth to the VIth subgroup as well as Fe, Si, B and C, preferably an AlTi, AlTa, AlV, AlCr or an AlZr alloy in an atmosphere containing oxygen. In this case, preferably no or only a relatively small proportion of inert gas, such as nitrogen, preferably less than 20% by volume, in particular less than 10% by volume, is used in order to ensure a complete oxidation of the metal particles evaporated from the targets. A similarly good distribution of the spark on the target surface can be observed in the production of insulating boridic layers, such as for example $TiB_2$. Here too the process can be carried out in an atmosphere containing borane, for example with di-borane, also without or with only little admixing of inert gas, for example nitrogen.

By way of explanation for this behavior, without claim to being complete and scientific proof, one can consider the different electron emission or electron work function from metallic to insulating oxidic surfaces. For example, aluminum oxide exhibits a considerably higher electron emission than metallic aluminum. Presumably, with the inventive method, the electron emission of the contaminated surface leads to a controlled spark course. Since the spark is no longer forced onto a path by the lateral acceleration of a radial magnetic field, it preferably jumps on the parts of the target with the highest electron emission. In the case of an aluminum target that is vaporized with sparks under oxygen, it runs to the place where the aluminum oxide layer grows fastest. A weak perpendicular magnetic field can in this case additionally facilitate the emission, whilst on the contrary a perpendicular magnetic field that is too strong has negative consequences. The latter could be accounted for in that magnetic fields cannot be generated to a technically and commercially justifiable extent in a completely homogenous fashion over a target surface. With stronger perpendicular magnetic fields there also always is additionally an increasing parallel component that eventually limits the free movement of the spark on the surface. In order to hold the spark on the target's front side, known measures can be used, such as confinement rings of insulating material (e.g. boron nitride) or electrically conductive confinement rings that repel the spark through an eddy current field generated by the moving spark itself in the ring.

In order to produce technical layer systems with special functional characteristics, it is desirable depending on the application purpose to apply, together with the mentioned insulating layers, further layers onto the workpiece, for example metallic, nitridic, carbidic or carbonitridic undercoating and/or hard-coating, with the final coating step being preferably a layer containing oxides or an oxide layer. The latter can be used for example as abradable coating as oxidation protection for the hard-coatings underneath. For the deposition of the further layer systems, methods known per se can be envisaged, although advantageous are physical vapor deposition (PVD) methods such as sputter etching, low-voltage arc coating, yet again in particular spark evaporation. The production of multiple layer systems, where conducting and non-conducting or different insulating layers are deposited alternately, is possible with a method according to the invention. Additionally, an arc source can be operated for example alternately under nitrogen and oxygen, or several arc sources can be provided with different target material and then the one material can be deposited as nitride, carbonitride or other compound and the other material as non-conducting oxide. Furthermore, in contrast to other PVD (physical vapor deposition) and CVD (chemical vapor deposition) methods, transition layers between insulating and conducting layer zones can be generated without difficulty between the layers, for example with increasing falling oxygen content, which is a great advantage of the inventive method. By comparison, unstable parameter zones can occur with sputter etching processes through the surface contamination of targets (hysteresis curve), which results in sudden changes of the deposition conditions. The laborious setting of different temperature levels for the deposition of different hard materials and inert gas sweepings between the different process steps, such as are necessary with CVD methods, can also be dispensed with. Generally, this method can be carried out at much lower temperatures than CVD methods and is therefore for example also suitable for coating steels.

When depositing multiple layers the problem can arise of vaporizing different target materials, where some materials can be vaporized with a useful target exploitation only by applying a magnetic field. In these cases, it can be advantageous to overlay the DC source current additionally with a pulse signal. With respect to further details of such a process execution, reference is made to the two prior applications CH00518/05 and Ch1289/2005 mentioned here above, wherein two possibilities for such a pulse operation have been disclosed in detail. Furthermore, resulting from what has been previously mentioned, other demands can be made of the magnet system for arc evaporation of a metallically uncoated target material than of a magnet system for vaporizing the same material with an oxide coating. For example, it is advantageous for the arc evaporation of TiAl for depositing TiAlN to operate the source with a magnet system. Depending on the Ti/Al ratio, different magnet systems can in that case lead to optimum results, possibly with magnet systems on the order of the limits indicated above for the magnetic field strength or also exceeding them being used. In such cases, for example when using permanent magnets, if the magnetic field strength cannot be adapted to the different evaporation conditions (e.g. metallic, nitridic, oxidic target surface), then an additional pulse becomes advantageous, or even necessary, for oxidic target surfaces and correspondingly large magnetic fields.

The like is valid for making graded layers and mixed layers from oxides and for example nitrides and/or carbides. In these cases, not only does one work in a pure oxygen atmosphere, but in gas mixtures with a different, often small proportion of oxygen. Under these conditions, the electron emission at the target surface is not completely controlled by the oxygen, since there is only a partially oxide-coated target surface. Here too, it can be advantageous to provide an additional pulse of the target current.

Although it is generally possible with the inventive method without any further measures to deposit insulating layers, it can nevertheless be advantageous under certain conditions, as mentioned above, to power the arc source simultaneously with a direct current as well as with a pulse or an alternating current. In this case, the DC proportion of the current flow is advantageously set in the range of 100 to 300%, in particular between 100 and 200% of the hold current. Hold current is understood as the smallest current that will still allow a stable operation of an electric conducting arc source with a simple DC power supply. The value of the hold current and the hold performance then depends on the target material, on the type of construction of the arc source, and on the discharge operation, for example whether the latter takes place under vacuum with or without adjunction of inert or reactive gas. This corresponds, with the usual target materials and use of the arc sources described further below, to a DC power flow in the range between 30 to 90 A, preferably between 30 and 60 A.

In a special embodiment, the pulse current supply can be operated between a cathode and a second electrode arranged separately from the arc source, in particular a cathode of a further arc source. Alternatively, the pulse current supply can also be inserted between the arc source and another type of source, for example a sputter cathode of a sputter source, in particular of a magnetron.

In order to generate the magnetic field, for example an axially polarized magnet system known as such, consisting of at least one coil with a geometry similar in size to the target, can be supplied with an induction current. The magnet system is placed essentially in one plane with the target surface, or preferably behind the target surface, since in this case placing the coil to atmosphere is possible relatively easily. The geometry of the magnet system can then also, in order to reduce space requirements, be chosen somewhat smaller in size than the target. However, if a particularly regular vertical distribution is desired, the same or even a slightly larger geometry, which for example also includes surrounding the target, parallel to and as close as possible to the geometric plane of the target surface, is advantageous. Use of Helmholtz arrangements at a distance, which generate a magnetic field over large areas of the installation, is not necessary and for reasons of flexibility, also not desirable.

In a particularly easy manner, such a magnetic field can be generated by having the direct current and/or the pulse or alternating current of the current source directed over a coil, for example a coil of the aforementioned design, to the cathode. In this case, it is possible to do without a generator for the magnet coil. Use of such a serial connection of coil and cathode in pulsed operation is particularly effective when an additional ionization occurs that assists the pulsed operation and increases the electron emission. For this purpose, the number of windings of the coil for the above indicated source currents is advantageously chosen between 1 and 20, preferably between 1 and 10, in particular between 1 and 5 windings. It is thus also possible to set the magnetic field essentially to the size of the respective values of the intrinsic magnetic field of the arc current, which usually ranges in an order of magnitude smaller than or equal to 10 Gauss. A momentarily higher external magnetic field, which can arise for example when going through a pulse peak or a steep pulse flank through the coil, will usually not cause any disturbance.

Alternatively it is of course also possible to power the magnetic field separately from a DC or pulsed operated arc source with its own pulse supply and control. If the arc source is also pulsed, a synchronizing can be provided.

In this manner, it is possible with a corresponding layout of the coils and if necessary with additionally providing a magnet ring to generate also larger magnetic fields, if a higher plasma density is desired. In this case, it is advantageous for the deposition of insulating layers to apply additionally to the DC signal applied to the arc sources a pulse signal as mentioned above.

Furthermore, it is advantageous to perform the method with an arc source wherein between the cathode and the anode a stop ring electrically insulated from both is placed, and the latter is made either of an electrical insulator, such as for example BN, or of a highly conducting metal, such as for example Al, Cu, Ag. This, especially in combination with a small magnetic field, ensures that the spark does not leave the surface of the target.

SHORT DESCRIPTION OF THE DRAWINGS

Hereinafter, the invention will be described in more detail on the basis of figures, which merely represent different embodiments. The figures show:
FIG. 1 Surfaces of reactively arced targets
FIG. 2 Arc source with magnet system
FIG. 3 Field strength Z with known method
FIG. 4 Field strength V with known method
FIG. 5 Arc source with coil
FIG. 6 Field strength with inventive method In FIG. 1, the state of the surface of different spark targets after operation in a pure oxygen atmosphere can be seen. For the test, targets with a diameter of 160 mm and a thickness of 6 mm were mounted onto a standard arc source of the company Balzers in an RCS coating installation and operated under use of different magnet systems for 50 minutes with a source current of 180 A in a pure oxygen atmosphere. The used parameters were as follows:

Figure 1:
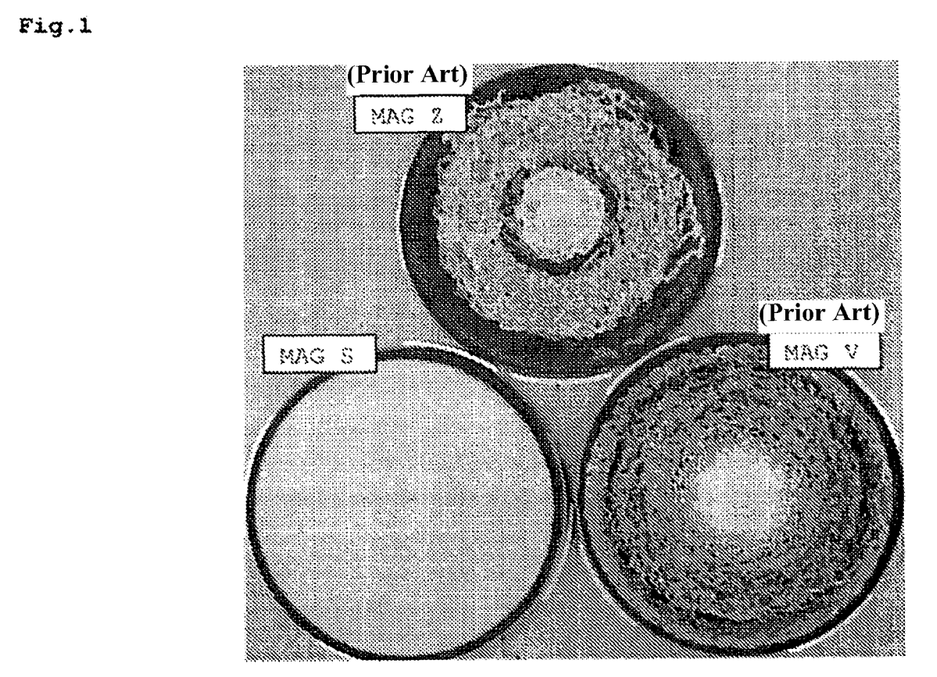

| Source current$_{arc}$: | 180 A |
| --- | --- |
| O$_2$-flow: | gradually increased from 400 sccm to 1600 sccm, done in a pure oxygen atmosphere |
| Increments: | 300 sccm/10 minutes |
| Pressure during process: | 0.44 to 4.9 Pa |
| Substrate voltage: | bipolar asymmetrical pulse: −100 V/36 µs, +100 V/4 µs |
| Temperature$_{substrate}$: | 550° C. |

In FIG. 1, "MAG Z" and "MAG V" designate two targets that were operated with a relatively strong magnetic field with a pronounced radial component B$_r$. The surface shows in both cases a very irregular removal and clear, essentially circular traces of the sparks' progression. In doing so, the spark left comparatively deep traces and in both cases, clearly recognizable optically, a removal maximum in the center of the target. The surface in both cases is so coarse and damaged that the targets could no longer be used any further without additional treatment of the surface. The spark course itself constricts itself ever more during operation and process instabilities occur. Such a behavior could so far only be avoided to a large extent, as described in CH00518/05 and CH1289/2005, by pulsing the target current. This however entails an additional complexity and requires special current supplies.

A totally different image is shown by the surface in FIG. 1 "MAG S", which with the exception of the magnetic field was otherwise operated under the same parameters as the surfaces of the targets MAG Z and MAG V in FIG. 1. The surface appears regularly removed over the entire area, which could also be confirmed through profilometer measurements. The prerequisite for such a behavior is a small magnetic field with at least a small radial component. The vertical component can be chosen somewhat more freely. Hereinafter, the essential differences of the used magnet systems will be briefly addressed.

Figure 2:
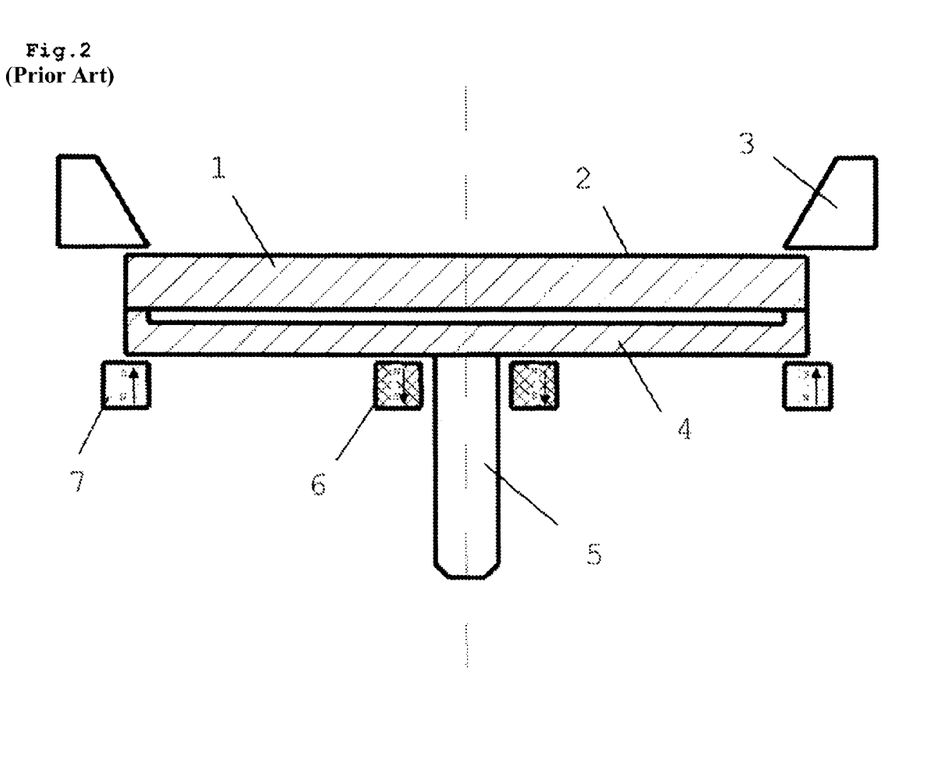

FIG. 2 shows a diagrammatic cross section through an arc source with a magnet system such as was used for the targets of FIG. 1 MAG Z and MAG V. Around the surface 2 of a target 1 mounted on a cooling plate 4, a circumferential confinement ring 3 is placed for restricting the spark on the target surface. A usually also circumferential backing electrode, mostly an anode, is not represented here in more detail. In the central rearward portion of the target is the current supply 5, which can also include a cooling water supply and drainage, not represented here in more detail. Also positioned in the central rearward portion is an inner permanent magnet ring 6, an outer permanent magnet ring 7 is placed in the region of the outer target circumference. Both magnet rings are axially magnetized with opposing polarities, so that part of the field lines exiting from the upper side of the outer permanent magnet ring 7 enter again in the upper side of the inner permanent magnet ring 6, whilst the field line course on the back relatively to the ring plane runs essentially in mirror image. To change the field strength, it is possible to use for example magnets with different strengths, additionally a coil as in FIG. 5, or also other dispositions.

Figure 3:
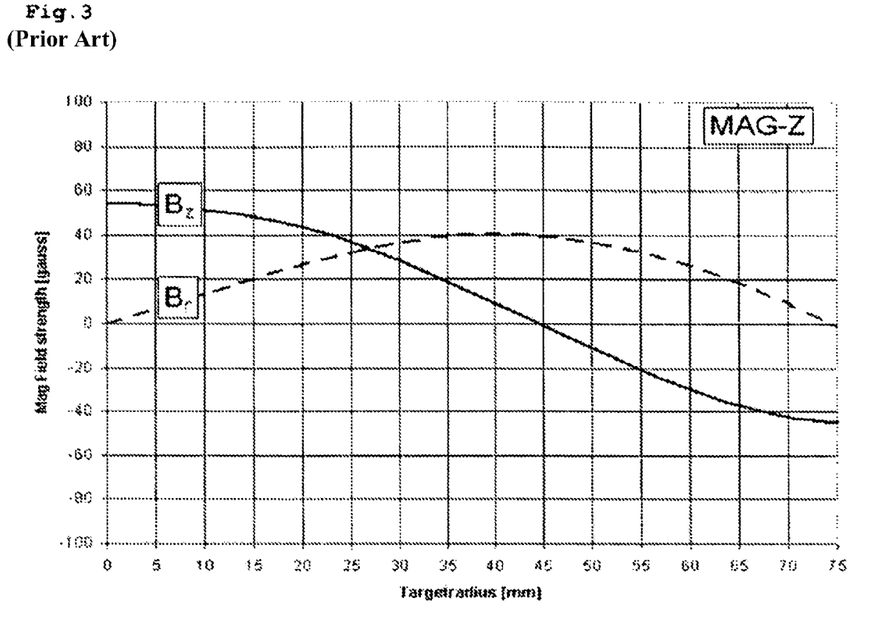

In FIG. 3, the local field strength of a magnet system is represented as it arises on the surface of an arc target when a thus constructed serial magnet system "MAG Z" of the company Balzers is used. The figure shows the field strength progression of the vertical component B$_z$ and of the radial component B$_r$ on half a target. B$_z$ exhibits a maximum in the middle (coordinate 0) and at the edge (75 mm) and goes through the zero line at approx. 45 mm. The 45° point defined by the intersection of the absolute components, i.e. the point in the area where the field lines inside at an angle of 45° on the target surface, lies at approx. 27 and 59 mm. In the area in-between, the radial component B$_r$ is greater than B$_z$ and goes through a maximum. In contrast to B$_z$, Br does not go through any change of direction on the respective target half and crosses the zero line respectively at the zero point and at the target edge. As expected, the area in-between, where relatively high radial acceleration forces are exerted on the spark or sparks progressing over the target, is a preferred stopping place, which can also be clearly seen from the corresponding erosion characteristic in FIG. 1 "MAG Z". On the other hand, because of the very small radial component in the central target zone and the associated slow movement of individual sparks, which leave the preferred stopping place, through overheating and consequently explosion-like evaporation, this also results in an increased removal, a damaging of the surface and a higher droplet formation. This effect is of less consequence at the target edge, since on the one hand less sparks per area in relation to the central area migrate from the preferred area, and on the other hand the spark is repelled through a self-induced eddy current field in the ring made of metal, for example of copper.

Figure 4:
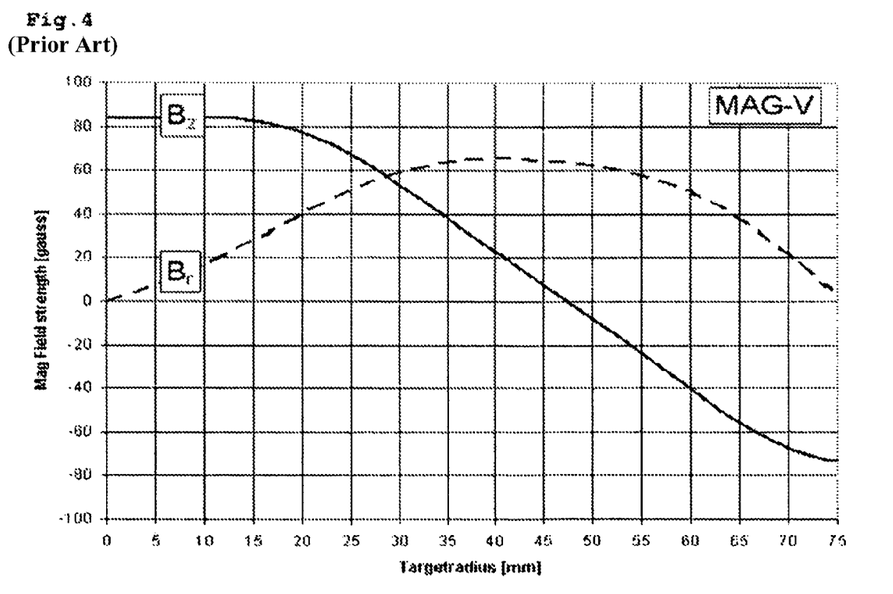

FIG. 4 shows the corresponding field strength characteristic of the target shown for the evaporation in FIG. 1 with magnet system "MAG V". With a characteristic that is in principle similar, the magnetic field differs through a field strength for both components that is on average approximately 50% higher as compared with FIG. 3. Accordingly, an increased removal can be seen in FIG. 1 "MAG V" on the target surface also at its outer perimeter. In this case as well, the surface is heavily damaged.

Figure 5:
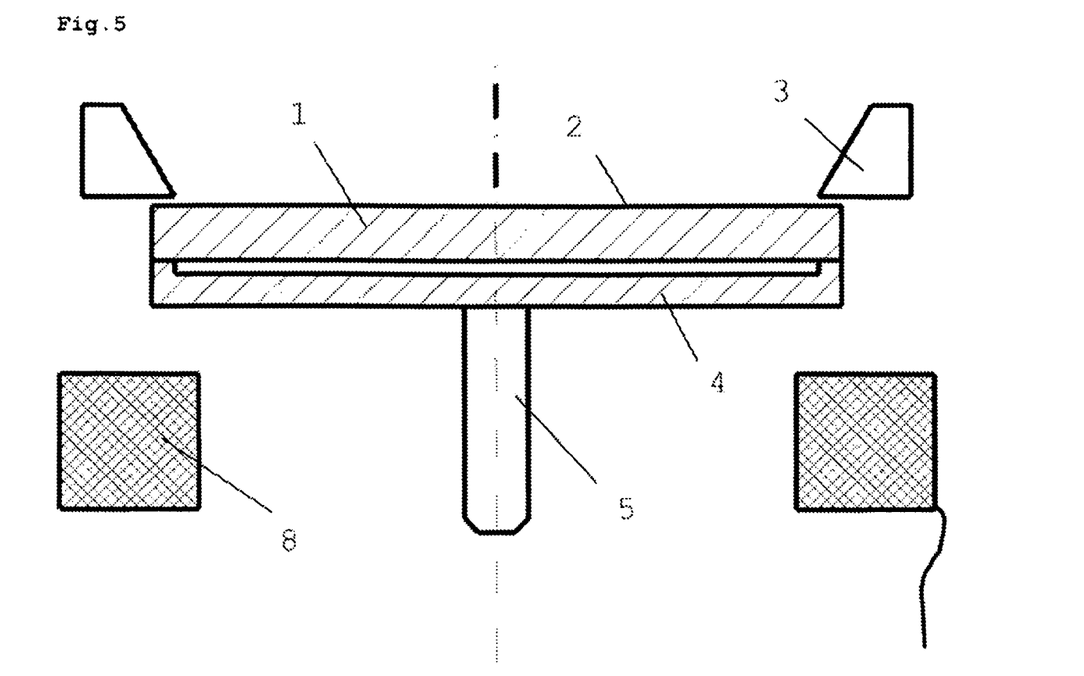

Finally, FIG. 5 shows a diagrammatic cross section through an arc source with a magnet system "MAG S" 8, as was used for the evaporation of the surfaces of the target in FIG. 1 MAG S" according to the inventive method. Instead of the permanent magnet rings 6, 7 of FIG. 2, an electromagnetic coil 8 is used placed behind the target 1 in the area of the target volume projection.

Magnet systems that are constructed from one or several electric coils, without or with only minor assistance through strong permanent magnets, are advantageous here. With these systems, the coil current can be modified in a similar manner to changing the target's surface state. For example, to create a continual transition between a conducting nitridic hard-coating to a non-conducting oxidic layer, the magnetic field can be lowered parallel to the nitrogen ramp, whilst the oxygen flow is continually increased. In this manner, even without a pulse operation of the arc source, any continual transitions can be created with materials that require a magnetic field assistance for the evaporation of the conducting surface.

Figure 6:
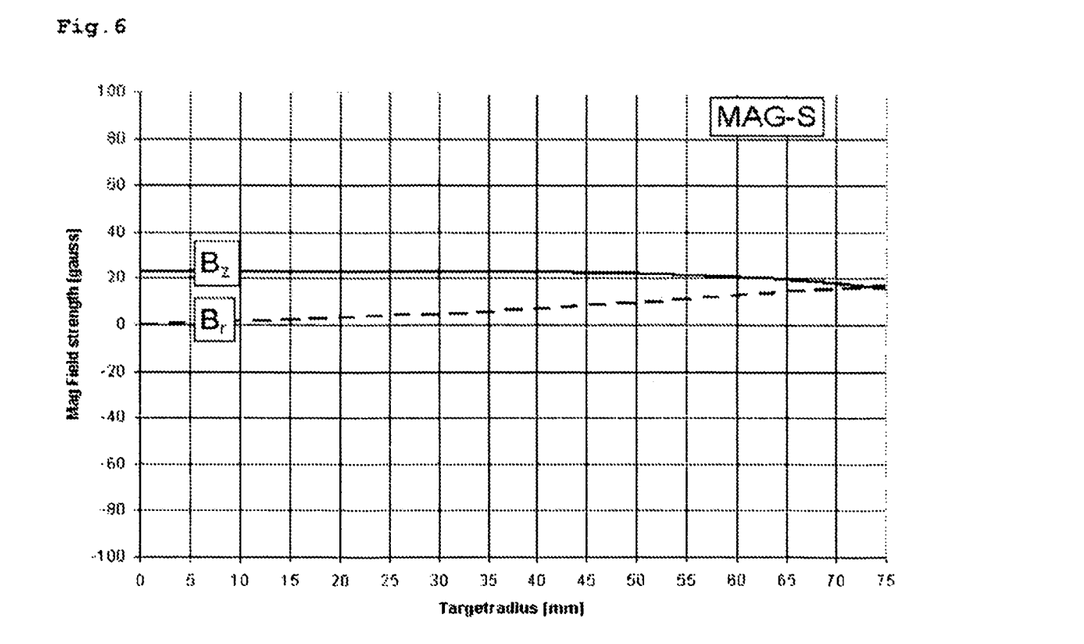

In FIG. 6, the field strength that arises when operating such a magnet system with low currents is represented. In this case, a serial magnet system "MAG S" (432 windings) of the company Balzers was operated with a current of 1 A. In this manner, it is possible as represented to set magnetic fields with a very regular course of the $B_z$ component as well as on average a very small Br component. Advantageously, the $B_z$ component is set at less than 50 Gauss, in particular lower than or equal to 30 Gauss. Although the arc sources in an oxygen atmosphere can surprisingly also be operated in principle without magnetic field assistance with an acceptable rate and an erosion pattern similar to that of FIG. 1 "MAG S", the use of a magnet system as just described will however achieve a somewhat better distribution. An effect could already be observed with fields with a $B_z$ lower than 10 Gauss, for example at 3 and 5 Gauss. In this case, it is advantageous to have a $B_z$-course that is as regular as possible and does not fluctuate by more than 10 up to maximum 20%. A somewhat greater divergence is allowable only in the target edge zone, approximately 10 to 20 mm from the target edge. Additionally, such a magnet system makes easier the kind of coating method where the target is used successively for generating conducting and low-conductivity insulating layers, since the fields here can be adapted to the respective method step. In order to optimize such methods, it is of course also possible to use other magnet systems known to the one skilled in the art. For example, it could be advantageous for certain processes to use an additional system that can be displaced perpendicularly to the target plane in order to create, for example as for the production of certain metal nitrides, a favorable magnetic field distribution with larger magnetic fields on the target upper side more or less similar to FIGS. 3 and 4.

In the following example, a complete procedure of a coating method according to the invention with a weak essentially perpendicular magnetic field in the area of the target surface will be given.

After inserting the workpiece into two- or three-way rotatable holders provided to this effect and placing the holders in the vacuum treatment installation, the treatment chamber is pumped out to a pressure of approx. $10^{-4}$ mbar.

To set the process temperature, a low-voltage arc plasma assisted by radiant heaters is struck between a cathode chamber, separated by a screen, with a hot cathode, and the anodic connected workpieces in an argon-hydrogen atmosphere.

The following heating parameters are then set:

| | |
|---|---|
| Discharge current$_{low\text{-}voltage\ arc}$: | 250 A |
| Argon flow: | 50 sccm |
| Hydrogen flow: | 300 sccm |
| Process pressure: | $1.4 \times 10^{-2}$ mbar |
| Substrate temperature: | approx. 550° C. |
| Process time: | 45 minutes |

Alternatives to this are known to the one skilled in the art. The substrates in the process were preferably connected as anode for the low-voltage arc and preferably additionally pulsed in unipolar or bipolar mode.

As the next process step, the etching is started. For this, the low-voltage arc is operated between the filament and the auxiliary anode. Here too a DC, a pulsed DC or a medium frequency (MF) or radio frequency (RF) supply operated with alternating current can be connected between workpieces and mass. Preferably, the workpieces were however put under voltage with a negative bias voltage.

The following etching parameters were then set:

| | |
|---|---|
| Argon flow: | 60 sccm |
| Process pressure: | $2.4 \times 10^{-3}$ mbar |
| Discharge current$_{low\text{-}voltage\ arc}$: | 150 A |
| Substrate temperature: | approx. 500° C. |
| Process time: | 45 minutes |
| Bias: | 200-250 V |

In order to ensure the stability of the low-voltage arc discharge when producing insulating layers, during all low-voltage arc assisted process steps one either works with a hot conducting auxiliary anode or switches a pulsed high-voltage supply between auxiliary anode and mass.

In the next process steps, the substrate is coated with an AlCrO layer and a TiAlN intermediate layer. All coating processes can, if an increased ionization is needed, be further assisted through the plasma of the low-voltage arc.

In the process, the following parameters were set for the deposition of the TiAlN intermediate layer:

The following etching parameters were then set:

| | |
|---|---|
| Argon flow: | 0 sccm (without adjunction of argon) |
| Nitrogen flow: | pressure controlled to 3 Pa |
| Process pressure: | $3 \times 10^{-2}$ mbar |
| DC source current TiAl: | 200 A |
| Current of source magnetic field (MAG S): | 1 A |
| DC substrate bias: | U = −40 V |
| Substrate temperature: | approx. 550° C. |
| Process time: | 25 minutes |

For the approx. 15 minute-long transition to the actual function layer, the AlCr arc sources are engaged with a DC source current of 200 A, where the positive pole of the DC source is connected with the anode ring of the source and mass. A DC substrate bias of −40 V is applied to the substrates during this step. 5 minutes after the AlCr target has been switched on, the oxygen intake is started, the latter being set within 10 minutes from 50 to 1000 sccm. Simultaneously, $N_2$ is set back to approx. 100 sccm. Shortly before oxygen intake, the substrate bias of DC is commutated to bipolar pulses and increased to U=−60 V. At the end of the oxygen ramp, both TiAl targets are switched off. Thus the intermediate layer and the graded transition to the function layer are finished.

The coating of the substrates with the actual function layer takes place in pure oxygen. Since aluminum oxide yields insulating layers, either a pulsed or an AC bias supply is used.

The essential function layer parameters were then set as follows:

| | |
|---|---|
| Oxygen intake: | 1000 sccm |
| Process pressure: | $2 \times 10^{-2}$ mbar |
| DC source current A1: | 200 A |
| Current of the source magnetic field (MAG S): | 0.5 A |
| Substrate bias: | U = 60 V (bipolar, 36 µs negative, 4 µs positive) |
| Substrate temperature: | approx. 550° C. |
| Process time: | 60 to 120 minutes |

The process described above allows good undercoating and hard layers to be generated. Comparative tests of the layer on lathe and milling tools have yielded a clearly improved durability compared to known TiAlN layers, although the coarseness lay clearly above the coarseness values of optimized pure TiAlN layers.

The invention claimed is:

1. Method for producing a low-conductivity layer on a workpiece by vacuum coating, the method comprising: operating an electrical arc discharge between an anode and a cathode of an arc source in an atmosphere containing a reactive gas, the cathode being electrically connected to a target; and supplying to the cathode, from a current source, an excitation current conducted by a magnet system comprising at least one essentially axially-polarized coil with a geometry similar in size to that of the target to apply an external magnetic field essentially perpendicular to a target surface of the target electrically connected to the cathode, said magnetic field comprising a vertical component $B_z$ and a relatively smaller component $B_r$ parallel to the target surface, wherein the excitation current is (i) a direct current and/or a pulsed current or (ii) an alternating current that is supplied to the cathode through the coil.

2. Method according to claim 1, characterized in that the vertical component $B_z$ at the target surface is set in a range between 3 and 50 Gauss.

3. Method according to claim 1, characterized in that the magnet system is arranged behind the target surface, in a magnet plane that is separated from a target plane of the target surface, so that the magnet system is behind a plane in which a bottom surface of the target is located.

4. Method according to one of the preceding claims, characterized in that the electrical arc discharge is powered simultaneously with (i) a direct current and with (ii) a pulsed current or an alternating current.

5. Method according to claim 4, characterized in that an insulation coating present on the target surface results in an increase of a DC proportion of the excitation current of at least 10% compared to that on the target surface without the insulation coating.

6. Method according to claim 4, characterized in that a pulse current supply is operated between the cathode of the arc source as a first electrode and a second electrode disposed separately from the arc source.

7. Method according to claim 6, characterized in that the second electrode can be operated as a cathode of a further arc source that is electrically connected to a DC power supply.

8. Method according to claim 6, characterized in that a sputter cathode is connected as the second electrode.

9. Method according to claim 1, characterized in that at least two targets are operated in an arrangement opposite each other defining a space between the targets and the workpiece is positioned in the space between the targets.

10. Method according to claim 1, characterized in that the coil is designed in such a manner that the external magnetic field, when the excitation current flows, sets itself essentially to a value of an intrinsic magnetic field of an arc current.

11. Method according to claim 10, characterized in that the coil comprises a winding number between 1 to 20.

12. Method according to claim 1, characterized in that the target is formed from an aluminum alloy and the aluminum alloy or a compound of the aluminum alloy is evaporated from the target surface.

13. Method according to claim 12, characterized in that the aluminum alloy comprises a transition metal selected from subgroup IV to subgroup VI, Fe, Si, B and C.

14. Method according to claim 1, characterized in that the atmosphere containing the reactive gas comprises oxygen, and a layer comprising an oxide is deposited.

15. Method according to claim 14, characterized in that in addition to the layer comprising the oxide, at least one other undercoating and/or hard layer is laid on the workpiece, an outermost coating comprises an oxide layer.

16. Method according to claim 15, further comprising, between two directly successive layers of said undercoating and/or hard layers, forming a transition layer comprising elements of the two directly successive layers.

17. Method according to claim 1, characterized in that the atmosphere containing the reactive gas includes a compound comprising boron, and a boridic layer is deposited.

18. Method for producing a low-conductivity layer on a workpiece by vacuum coating, the method comprising: operating an arc discharge between an anode and a cathode of an arc source in an atmosphere containing a reactive gas within a vacuum coating installation where at least one additional coating source is located; and applying an external magnetic field essentially perpendicular to a target surface of a target electrically connected to the cathode, said external magnetic field comprising a vertical component $B_z$ as well as an essentially smaller component $B_r$ radial or parallel to the surface, to assist an evaporation process, wherein the at least one additional coating source is arranged in the vacuum coating installation in such a manner that a degree of recoating of the target surface is less than 10% of a quantity of metal vaporized by the cathode.

19. Method according to claim 18, characterized in that the vertical component $B_z$ at the target surface is set lower than 50 Gauss.

20. Method for producing a low-conductivity layer on a workpiece by vacuum coating, the method comprising: supplying a direct current and/or a pulse alternating current from a current generator to an arc source to operate an electrical arc discharge between a cathode and an anode of the arc source, the cathode and the anode being separated by a stop ring that is electrically insulated from both the cathode and the anode, in an atmosphere containing a reactive gas; and generating an external magnetic field essentially perpendicular to a target surface of a target electrically connected to the cathode to assist an evaporation process, wherein the stop ring is made either of an electrical insulator or of a highly conducting metal; and wherein the electrical arc discharge current is conducted to the arc source through a magnetic coil employed for generating the external magnetic field.

* * * * *